United States Patent
Wang et al.

(10) Patent No.: US 10,381,428 B2
(45) Date of Patent: Aug. 13, 2019

(54) ARRAY SUBSTRATE, MANUFACTURE METHOD THEREOF, DISPLAY DEVICE

(71) Applicant: BOE TECHNOLOGY GROUP CO., LTD., Beijing (CN)

(72) Inventors: Dongfang Wang, Beijing (CN); Hongda Sun, Beijing (CN); Li Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 22 days.

(21) Appl. No.: 14/893,325

(22) PCT Filed: Apr. 17, 2015

(86) PCT No.: PCT/CN2015/076914
§ 371 (c)(1),
(2) Date: Nov. 23, 2015

(87) PCT Pub. No.: WO2016/086571
PCT Pub. Date: Jun. 9, 2016

(65) Prior Publication Data
US 2016/0329395 A1    Nov. 10, 2016

(30) Foreign Application Priority Data
Dec. 1, 2014   (CN) .......................... 2014 1 0720593

(51) Int. Cl.
*H01L 27/32* (2006.01)
*H01L 51/00* (2006.01)
(Continued)

(52) U.S. Cl.
CPC ...... *H01L 27/3276* (2013.01); *H01L 27/3258* (2013.01); *H01L 27/3262* (2013.01);
(Continued)

(58) Field of Classification Search
CPC .................................................. H01L 27/3276
See application file for complete search history.

(56) References Cited

U.S. PATENT DOCUMENTS 7,456,566 B2 * 11/2008 Seo ..................... H01L 51/5271
257/E29.147
7,548,019 B2    6/2009 Omura et al.
(Continued)

FOREIGN PATENT DOCUMENTS

CN          1717135 A      1/2006
CN       101556991 A     10/2009
(Continued)

OTHER PUBLICATIONS

Machine translation, Arai, Japanese Pat. Pub. No. JP 2001-60495, translation date: Dec. 19, 2018, Espacenet, all pages.*
(Continued)

*Primary Examiner* — Victoria K. Hall
(74) *Attorney, Agent, or Firm* — Collard & Roe, P.C.

(57) ABSTRACT

An array substrate, a manufacture method thereof, and a display device are provided. The array substrate includes a first electrode (12), a second electrode (15); a light-emitting functional layer (13) located between the first electrode (12) and the second electrode (15); and an organic planar layer (14). The first electrode (12) is formed on the organic planar layer (14). The first electrode (12) includes metal electrode or metal alloy electrode. An oxide conductive layer (16) is further formed between the organic planar layer (14) and the first electrode (12).

15 Claims, 4 Drawing Sheets

(51) Int. Cl.
*H01L 51/52* (2006.01)
*H01L 51/56* (2006.01)

(52) U.S. Cl.
CPC ...... *H01L 51/0021* (2013.01); *H01L 51/5203* (2013.01); *H01L 51/5212* (2013.01); *H01L 51/5231* (2013.01); *H01L 51/56* (2013.01)

(56) References Cited

U.S. PATENT DOCUMENTS

| | | | |
|---|---|---|---|
| 8,039,839 B2 | 10/2011 | Kwon | |
| 8,415,658 B2 | 4/2013 | Kashiwabara | |
| 9,685,489 B2* | 6/2017 | Shi | H01L 51/5215 |
| 2002/0140887 A1* | 10/2002 | Maeda | G02F 1/133553 |
| | | | 349/113 |
| 2005/0017632 A1* | 1/2005 | Hou | H01L 51/5092 |
| | | | 313/506 |
| 2005/0122030 A1* | 6/2005 | Sakamoto | H01J 9/02 |
| | | | 313/496 |
| 2008/0111484 A1* | 5/2008 | Kwon | H01L 27/3248 |
| | | | 313/506 |
| 2008/0309232 A1 | 12/2008 | Yamamoto | |
| 2009/0194780 A1* | 8/2009 | Kwon | H01L 27/3246 |
| | | | 257/98 |
| 2010/0072884 A1* | 3/2010 | Tchakarov | B32B 17/10036 |
| | | | 313/504 |
| 2011/0049492 A1* | 3/2011 | Sawaki | B82Y 10/00 |
| | | | 257/40 |
| 2011/0199551 A1 | 8/2011 | Asai et al. | |
| 2012/0120357 A1* | 5/2012 | Jiroku | G02F 1/136227 |
| | | | 349/123 |
| 2012/0205701 A1* | 8/2012 | Sasaki | H01L 51/5218 |
| | | | 257/98 |
| 2015/0034932 A1* | 2/2015 | Choi | H01L 27/3258 |
| | | | 257/40 |
| 2015/0340413 A1* | 11/2015 | Lee | G09G 3/3291 |
| | | | 257/40 |
| 2016/0155989 A1* | 6/2016 | To | H01L 27/3276 |
| | | | 257/40 |

FOREIGN PATENT DOCUMENTS

| | | | | |
|---|---|---|---|---|
| CN | 101931057 A | | 12/2010 | |
| CN | 102637830 A | | 8/2012 | |
| CN | 103730481 A | | 4/2014 | |
| CN | 104393023 A | | 3/2015 | |
| CN | 204271084 U | | 4/2015 | |
| JP | S62-10841 | * | 1/1987 | ............. H01J 29/07 |
| JP | H1-165151 | * | 6/1989 | ............. H01L 23/28 |
| JP | 2001-60495 | * | 3/2001 | ............. H05B 33/12 |
| WO | WO 2007/116369 | * | 10/2007 | ............. H01L 51/52 |

OTHER PUBLICATIONS

Machine translation, Ishii, Japanese Pat. Pub. No. JP H1-165151, translation date: Dec. 19, 2018, Espacenet, all pages.*
Machine translation, Watanabe, Japanese Pat. Pub. No. JP S62-10841, translation date: Dec. 19, 2018, Espacenet, all pages.*
Chinese Office Action in Chinese Application No. 201410720593.9, dated Sep. 26, 2016 with English translation.
International Search Report of PCT/CN2015/076914 in Chinese, dated Sep. 2, 2015 with English translation.
Notice of Transmittal of the International Search Report of PCT/CN2015/076914 in Chinese, dated Sep. 2, 2015.
Written Opinion of the International Searching Authority of PCT/CN2015/076914 in Chinese, dated Sep. 2, 2015 with English translation.
Second Chinese Office Action in Chinese Application No. 201410720593.9, dated Jun. 7, 2017 with English translation.

* cited by examiner

ARRAY SUBSTRATE, MANUFACTURE METHOD THEREOF, DISPLAY DEVICE

CROSS REFERENCE TO RELATED APPLICATIONS

This application is the National Stage of PCT/CN2015/076914 filed on Apr. 17, 2015, which claims priority under 35 U.S.C. § 119 of Chinese Application No. 201410720593.9 filed on Dec. 1, 2014, the disclosure of which is incorporated by reference.

TECHNICAL FILED

Embodiments of the present invention relate to an array substrate, a manufacture method thereof, and a display device.

BACKGROUND

Organic light-emitting diode (OLED) display panels can achieve self-luminous display, and are bendable and able to roll up, by being made from organic materials, and thus have been highly favored by users. The principle of the OLED display panel emitting light is in that organic materials are deposited between two electrodes, and the two electrodes will supply the organic materials with electric power so as to allow the organic materials to emit light.

SUMMARY

Embodiments of the present invention provide an array substrate, a manufacture method thereof, and a display device.

According to embodiments of the present invention, it provides an array substrate including a first electrode; a second electrode; a light-emitting functional layer located between the first electrode and the second electrode; and an organic planar layer, wherein the first electrode is formed on the organic planar layer, the first electrode includes metallic electrode or metal alloy electrode; and an oxide conductive layer is further formed between the organic planar layer and the first electrode.

Embodiments of the present invention provide a display device including any array substrate as provided by the embodiments of the present invention.

Embodiments of the present invention provide a manufacture method of array substrate, including: forming an organic planar layer; forming an oxide conductive layer on the organic planar layer; forming a first electrode on the oxide conductive layer; and forming a light-emitting functional layer and a second electrode.

BRIEF DESCRIPTION OF THE DRAWINGS

Embodiments of the present invention will be described in more detail below with reference to the accompanying drawings to enable an ordinary skill in the art to understand the present invention more clearly, wherein.

DETAILED DESCRIPTION

Technical solutions according to the embodiments of the present invention will be described clearly and completely as below in conjunction with the accompanying drawings of embodiments of the present invention. It is apparent that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly. For example, as used in embodiments of the present invention, terms "on" and "under/below" are interpreted with reference to a sequence when films are formed, for example, a film defined as being on the other film is a film formed later with respective to the other film, and a film defined as being under/below the other film is a film formed previously with respective to the other film.

Figure 1:
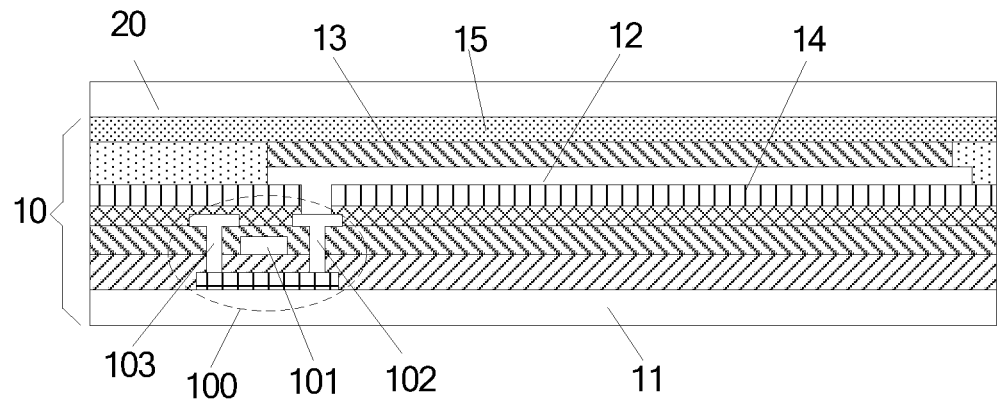
FIG. 1 is a schematic view illustrating an OLED display panel.

As illustrated in FIG. 1, an active matrix OLED display device includes an array substrate 10 and a package substrate 20 which are assembled with each other. The array substrate 10 has a substrate 11 provided with a plurality of driver thin film transistors (TFTs) 100 arranged in a matrix, a first electrode 12, a light-emitting functional layer (organic material) 13 and a second electrode 15 thereon. The driver TFT 100 includes a gate electrode 101, a source electrode 103 and a drain electrode 102. The drain electrode 102 of the driver TFT 100 is connected to the first electrode 12 and supplies the first electrode 12 with an electrical signal. The light-emitting functional layer 13 is formed between the second electrode 15 and the first electrode 12, and upon the driver TFT 100 supplying the first electrode 12 with an electrical signal and meanwhile a circuit board supplying the second electrode 15 with an electrical signal through a transmission lead, current is passed between the first electrode 12 and the second electrode 15 so as to enable the light-emitting functional layer 13 emitting light for display.

The first electrode is a conductive electrode, and it is usually made of metal or metal alloy in order to reduce a resistance thereof. For example, the first electrode is made of Al—Nd alloy. As shown in FIG. 1, the array substrate 12 further includes an organic planar layer 14 made of organic material, and the first electrode 12 is formed on the organic planar layer 14. However, the thermal coefficient of expansion of the organic planar layer is considerably different from that of a metal layer or metal alloy layer, and the metal layer or metal alloy layer has a poor adhesion to the organic planar layer. As a result, the metal layer or metal alloy layer is very likely to be separated from the organic planar layer due to a deformation of the metal layer or metal alloy layer caused by heating during the manufacture process of the display device or due to long term operation. As shown in FIG. 1, the first electrode 12 may be separated from the organic planar layer 14 by the heat dissipation from the TFT 100 due to long term operation, which may further compromise the display quality.

Embodiments of the present invention provide an array substrate, including: a first electrode, a second electrode, and a light-emitting functional layer located between the first electrode and the second electrode. The array substrate further includes an organic planar layer, and the first electrode is formed on the organic planar layer. The first electrode is a metal electrode or a metal alloy electrode. An oxide conductive layer is further formed between the organic planar layer and the metal electrode or the metal alloy electrode.

It should be explained that the mentioned first electrode and second electrode can be a cathode or an anode, respectively. That is, when the first electrode is a cathode, the second electrode is an anode; or, when the second electrode is a cathode, the first electrode is an anode. The cathode and anode used herein is defined with respective to a current direction of the light-emitting functional layer, wherein the cathode serves to transmit electrons to the light-emitting functional layer and the anode serves to transmit holes to the light-emitting functional layer. For example, if the first electrode is a metal electrode or a metal alloy electrode, the second electrode can be a transparent electrode formed of Indium Tin Oxide (ITO) or the like.

The first electrode is formed on the organic planar layer, and the oxide conductive layer is formed between the first electrode and the organic planar layer; that is, an oxide conductive layer is further formed between the organic planar layer and the metal electrode or metal alloy electrode. The oxide conductive layer has good adhesion to both of the organic planar layer and the metal electrode or metal alloy electrode, and has a thermal coefficient of expansion with less difference between that of the organic planar layer and the first electrode. As a result, it is rare that the oxide conductive layer separates from the organic planar layer on which it is formed, and it is rare that the metal electrode or metal alloy electrode separates from the oxide conductive layer on which it is formed. In addition, a lattice distortion of the oxide conductive layer is helpful for buffering and releasing a stress of the first electrode and the organic planar layer which are disposed adjacent to the oxide conductive layer. This is attributed to a reduced stress achieved by arranging a layer of structure in an intermediate state to reduce a difference in lattice match; such stress resulting from lattice mismatch due to direct contact between different crystalline structures is usually relatively larger and may result in contact issue. Furthermore, in this way, both of the first electrode and the organic planar layer would not easily separate from the oxide conductive layer. Embodiments of the present invention will be described in more details with Al used as the metal and Al-alloy electrode used as the metal alloy electrode, in an exemplary way.

Figure 2:
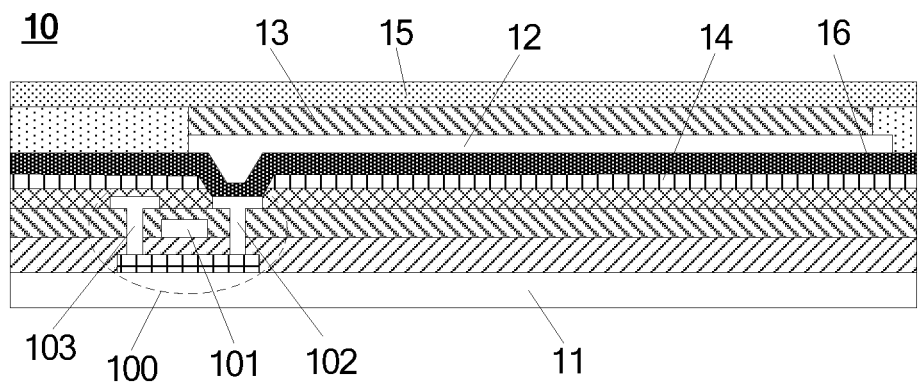
FIG. 2 is a schematic view illustrating an array substrate as provided by an embodiment of the present invention.

As illustrated in FIG. 2, the array substrate 10 includes an organic planar layer 14 and a first electrode 12 formed on the organic planar layer 14. For example, the first electrode 12 is Al electrode or Al-alloy electrode, and an oxide conductive layer 16 is further formed between the first electrode 12 and the organic planar layer 14. It should be understood that the array substrate can further include a passivation layer, a pixel defining layer and the like, although embodiments of the present invention merely illustrate certain structures such as films or layers which are in connection with the inventive concept by way of example. As illustrated in FIG. 2, the oxide conductive layer 16 is in direct contact with the organic planar layer 14, and the first electrode 12 is formed on the oxide conductive layer 16. The first electrode 12 has good adhesion to the oxide conductive layer 16, and the oxide conductive layer 16 also has good adhesion to the organic planar layer 14, meanwhile a thermal coefficient of expansion of the oxide conductive layer 16 is little different from that of both the organic planar layer 14 and the first electrode 12. As a result, the structures of films or layers can be formed on the array substrate in a more stable way so that the first electrode 12 would not easily separate from the oxide conductive layer 16 even under a long term use, and the display quality of the display panel when used is improved. In addition, due to the lattice distortion of the oxide conductive layer, it is helpful for buffering and releasing a stress of the adjacent metal electrode or metal alloy electrode and a stress of the adjacent organic planar layer. For example, when the first electrode is formed on the oxide conductive layer, the stress as generated during the forming process can be absorbed by the oxide conductive layer so that the first electrode would not easily separate from the oxide conductive layer.

Figure 3:
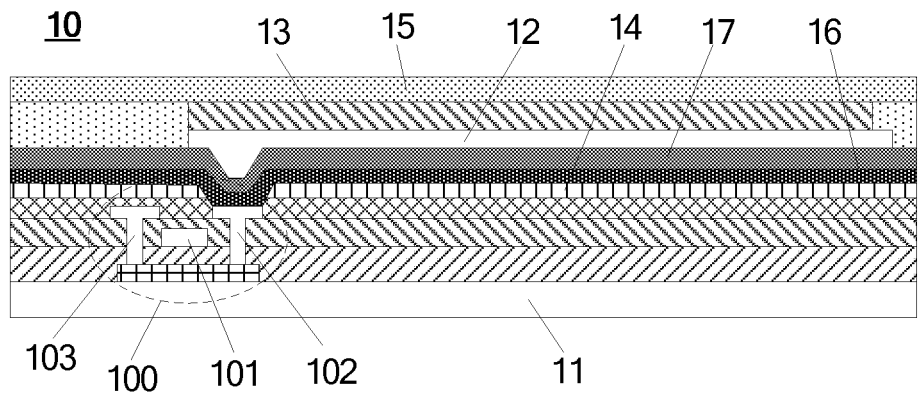
FIG. 3 is a schematic diagram illustrating another array substrate as provided by an embodiment of the present invention.

Optionally, as illustrated in FIG. 3, an inert metal layer 17 is further formed between the oxide conductive layer 16 and the first electrode 12. Optionally, a material forming the inert metal layer can be any one of Mo, Ti, Ta and Nb or a combination thereof. The metal alloy can be Al—Nd alloy or Al—B—Ni alloy. A content of Al in the Al—B—Ni alloy is 99.3%, a content of B in the Al—B—Ni alloy is 0.2%, and a content of Ni in the Al—B—Ni alloy is 0.5%. An electrode of active metal such as Al or metal alloy such as active Al alloy is easily oxidized. For display panels in long term use, oxygen atoms in the oxide conductive layer may partly migrate to oxidize the metal electrode or metal alloy electrode to generate oxides, which increases a resistance of the first electrode so that an inert metal layer is formed between the oxide conductive layer and the first electrode. The inert metal layer has good stability and also good adhesion to both the oxide conductive layer and the first electrode, so it is advantageous in preventing the electrode of active metal or active metal alloy from being oxidized. In addition, forming an inert metal layer between the oxide conductive layer and the first electrode is equivalent to electrically connecting the oxide conductive layer, the inert metal layer and the first electrode in parallel, which facilitates further reducing the resistance of the first electrode and improving the display quality.

For example, it can also provide other metal materials with good stability, such as Au and Pt, between the oxide conductive layer and the first electrode. However, such metal is usually expensive and leads to high cost of the display panel. Embodiments of the present invention can provide a metal layer of Mo between the oxide conductive layer and the first electrode, for example.

Optionally, the oxide conductive layer can be Indium Tin Oxide (ITO) conductive layer, Indium Zinc Oxide (IZO) layer, Indium Tin Zinc Oxide (ITZO) layer or Indium Gallium Zinc Oxide (IGZO) layer, and can also be a combined structure of these material layers.

It should be understood that the active matrix OLED display panel includes an array substrate and a package substrate. The array substrate is provided with a plurality of TFTs arranged in a matrix, a first electrode, an organic light-emitting functional layer and a second electrode formed on the TFTs. The display panel in which the display side is adjacent to the package substrate is referred to as a top-emitting display panel, while the display panel in which the display side is adjacent to the array substrate is referred to as bottom-emitting display panel. The array substrate as provided by embodiments of the present invention can be applied to an active matrix display panel or an passive matrix display panel.

Optionally, as illustrated in FIG. 2 and FIG. 3, the array substrate 10 further includes a TFT 100 located below the organic planar layer 14. The TFT 100 includes a gate electrode 101, a source electrode 103 and a drain electrode 102. The organic planar layer 14 covers the TFT 100. The first electrode 12 is electrically connected to the drain electrode 102. The display panel is of top-emitting type. The second electrode 15 is a transparent conductive electrode. Also, as illustrated in FIG. 3, an inert metal layer 17 is formed between the oxide conductive layer 16 and the first electrode 12. That is, in the top-emitting display panel, the second electrode adjacent to the display side is a transparent conductive electrode, and the first electrode far away from the display side is a high-reflective electrode formed of metal or metal alloy.

The transparent conductive electrode can be formed by using ITO, IZO, ITZO or IGZO as provided by the embodiments of the present invention.

For example, the first electrode and the drain electrode can be electrically connected by any ways as below.

Optionally, as illustrated in FIG. 2, the organic planar layer 14 is formed with a via hole at a location corresponding to the drain electrode 102 of the TFT 100, and the first electrode 12 and the oxide conductive layer 16 are electrically connected to the drain electrode 12 of the TFT 100 through the via hole. That is, the oxide conductive layer is electrically connected to the drain electrode by directly contacting there-with through the via hole. The first electrode is in direct contact with the oxide conductive layer and electrically connected to the drain electrode.

Figure 11:
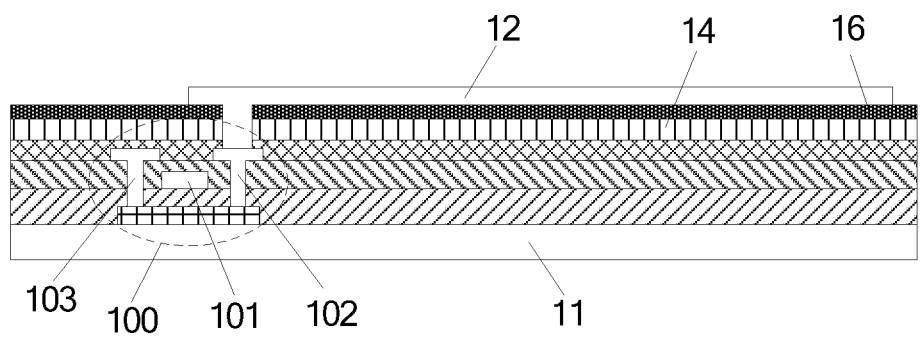
FIG. 11 is a schematic view illustrating an electrical connection between a first electrode and a drain electrode as provided by an embodiment of the present invention.

Alternatively, as illustrated in FIG. 11, the organic planar layer 14 and the oxide conductive layer 16 are formed with a via hole at a location corresponding to the drain electrode 102 of the TFT 100, and the first electrode 12 is electrically connected to the drain electrode 102 of the TFT 100 by directly contacting there-with through the via hole.

In a case where the array substrate further includes an inert metal layer, the first electrode and the drain electrode can be electrically connected by any ways as below.

Figure 10:
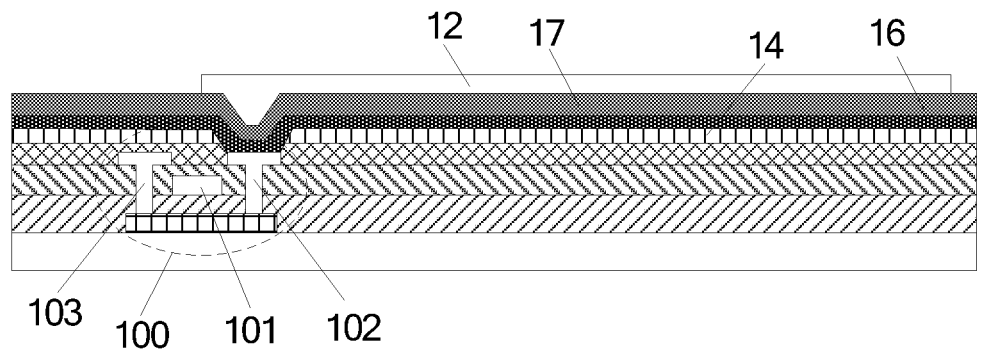
FIG. 10 is a schematic view illustrating a process of forming a first electrode on an inert metal layer as provided by an embodiment of the present invention.

Optionally, as illustrated in FIG. 10, the organic planar layer 14 is formed with a via hole at a location corresponding to the drain electrode 102 of the TFT 100, and the first electrode 12, the inert metal layer 17 and the oxide conductive layer 16 are electrically connected to the drain electrode 102 of the TFT 100 through the via hole.

Alternatively, the organic planar layer and the oxide conductive layer are formed with a via hole at a location corresponding to the drain electrode 102 of the TFT 100, and the first electrode and the inert metal layer are electrically connected to the drain electrode of the TFT through the via hole. That is, the via hole is formed in the organic planar layer and in the oxide conductive layer, and the inert metal layer is electrically connected to the drain electrode of the TFT by directly contacting there-with through the via hole. The first electrode is in direct contact with the inert metal layer and electrically connected to the drain electrode.

Figure 12:
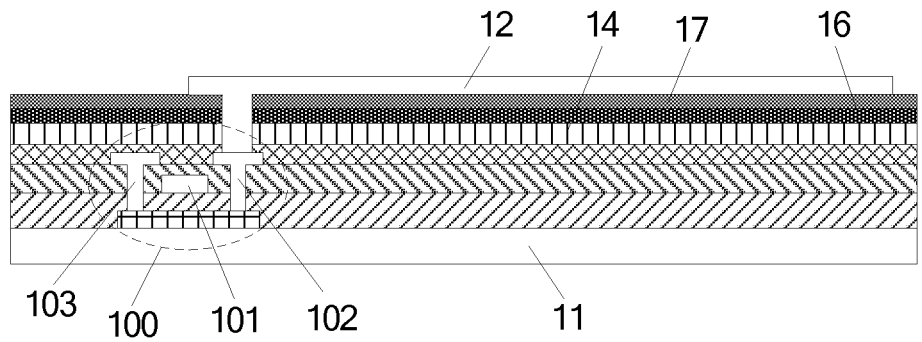
FIG. 12 is a schematic view illustrating another electrical connection between a first electrode and a drain electrode as provided by an embodiment of the present invention.

Alternatively, as illustrated in FIG. 12, the organic planar layer 14, the oxide conductive layer 16 and the inert metal layer 17 are formed with a via hole at a location corresponding to the drain electrode 102 of the TFT 100, and the first electrode 12 is electrically connected to the drain electrode 102 of the TFT 100 by directly contacting there-with through the via hole.

Embodiments of the present invention provide a display device including any array substrate as provided by embodiments of the present invention. The display device can be a display component such as OLED display and any product or assembly that includes the display component and possesses display function, such as television, digital camera, mobile phone and tablet computer.

Figure 4:
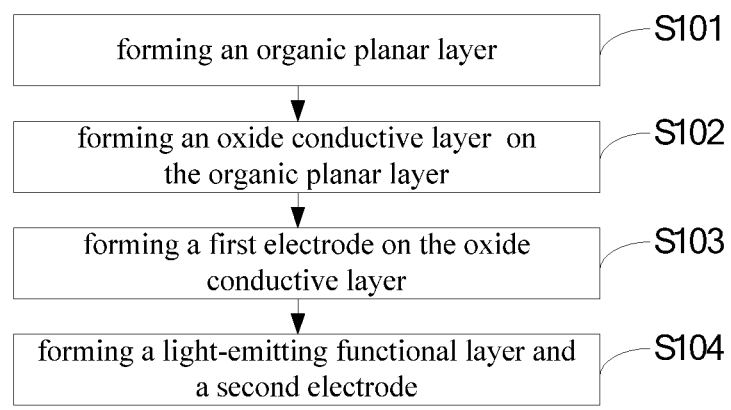
FIG. 4 is a schematic diagram illustrating a manufacture method of array substrate as provided by an embodiment of the present invention.

Embodiments of the present invention provide a manufacture method of array substrate as illustrated in FIG. 4, which includes the following steps.

Figure 5:
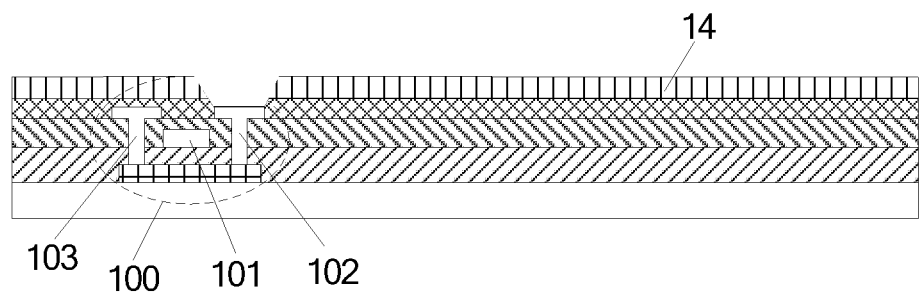
FIG. 5 is a schematic view illustrating a process of forming an organic planar layer as provided by an embodiment of the present invention.

Step S101, forming an organic planar layer 14, as illustrated in FIG. 5.

Figure 6:
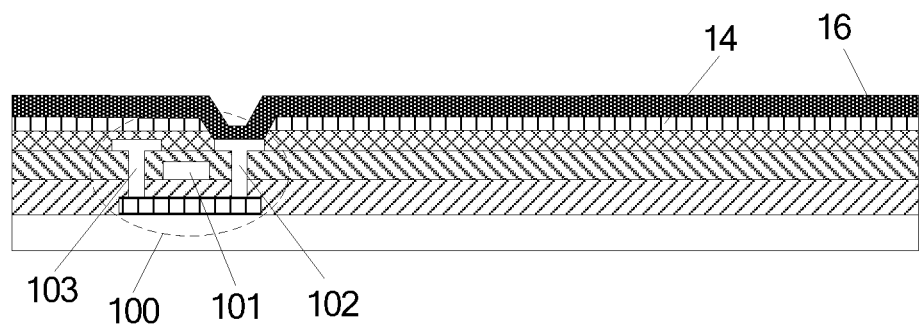
FIG. 6 is a schematic view illustrating a process of forming an oxide conductive layer on an organic planar layer as provided by an embodiment of the present invention.

Step S102, forming an oxide conductive layer 16 on the organic planar layer 14, as illustrated in FIG. 6. The material forming the oxide conductive layer can be any one of ITO, IZO, ITZO and IGZO, or a combination thereof.

Figure 7:
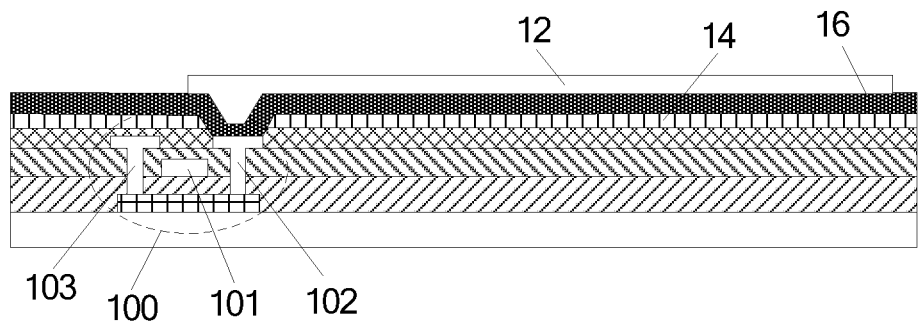
FIG. 7 is a schematic view illustrating a process of forming a first electrode on an oxide conductive layer as provided by an embodiment of the present invention.

Step S103, forming a first electrode 12 on the oxide conductive layer 16, as shown in FIG. 7. The first electrode can be formed of metal or metal alloy. For example, the metal is Al, and the metal alloy is an Al-alloy. For example, the Al-alloy can be an Al—Nd alloy or an Al—B—Ni alloy.

S104, forming a light-emitting functional layer 13 and a second electrode 15, as shown in FIG. 2.

Figure 8:
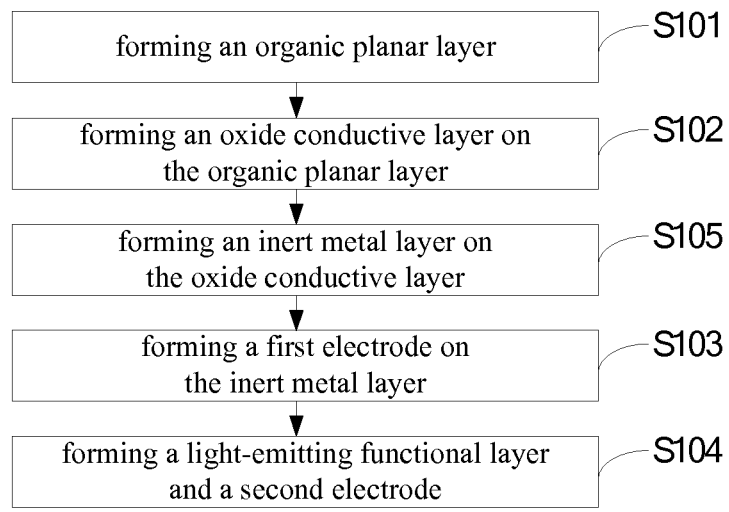
FIG. 8 is a schematic diagram illustrating another manufacture method of array substrate as provided by an embodiment of the present invention.

Alternatively, as illustrated in FIG. 8, it can further include a step between step S102 and S103 as below.

Figure 9:
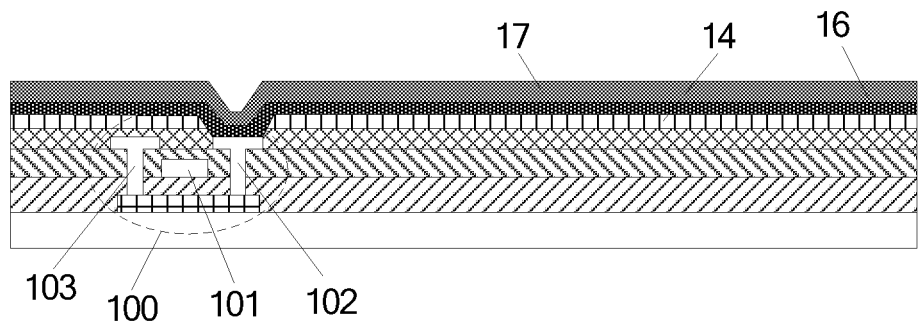
FIG. 9 is a schematic view illustrating a process of forming an inert metal layer formed on an oxide conductive layer as provided by an embodiment of the present invention.

Step S105, forming an inert metal layer 17 on the oxide conductive layer 16, as shown in FIG. 9. For example, the material forming the inert metal layer can be any one of Mo, Ti, Ta and Nb, or a combination thereof.

As shown in FIG. 10, the above-mentioned step S103 can include: forming a first electrode 12 on the inert metal layer 17. FIG. 3 shows the array substrate after the light-emitting functional layer 13 and the second electrode 15 formed on the first electrode 12.

Optionally, before the above-mentioned step Step101, the method further includes forming a TFT, as illustrated in FIGS. 5-7 and FIGS. 9-10, forming the TFT 100 includes forming a gate electrode 101, a source electrode 103 and a drain electrode 102. In a case where the display panel is a top-emitting display panel, the organic planar layer 14 covers the TFT 100, the first electrode 12 is electrically connected to the drain electrode 102, and the second electrode 15 is a transparent conductive electrode.

It should be understood that the first electrode is electrically connected to the drain electrode, for example, through a via hole. The first electrode can be electrically connected to the drain electrode through the via hole by any ways as below.

Optionally, the above-mentioned step S102 includes: forming a via hole in the organic planar layer 14 at a location corresponding to the drain electrode 102, as shown in FIG. 5. Forming the via hole in the organic planar layer can be performed after forming the organic planar layer, and can also be performed at the location corresponding to the drain electrode at the same time of forming the organic planar layer.

As shown in FIG. 6 and FIG. 7, the oxide conductive layer 16 formed on the organic planar layer 14 covers the via hole (i.e., the drain electrode 102), and the first electrode 12 as formed is electrically connected to the drain electrode 102 through the oxide conductive layer 16. Alternatively, as shown in FIG. 9 and FIG. 10, on the oxide conductive layer 16, it's further formed with an inert metal layer 17 which covers an area corresponding to the drain electrode 102, and the first electrode 12 as formed is electrically connected to the drain electrode 102 through the oxide conductive layer 16 and the inert metal layer 17.

Alternatively, as shown in FIG. 11, before forming the first electrode 12, the method further includes: forming a via hole in the organic planar layer 14 and in the oxide conductive layer 16 at a location corresponding to the drain electrode 102, and the first electrode 12 is directly electrically connected to the drain electrode 102 through the above-mentioned via hole.

Further optionally, as shown in FIG. 12, before forming the first electrode 12, the method further includes: forming a via hole in the organic layer 14, in the oxide conductive layer 16 and in the inert metal layer 17 at a location corresponding to the drain electrode 102, and the first electrode 12 is directly electrically connected to the drain electrode 102 through the above-mentioned via hole.

Further optionally, before forming the inert metal layer on the oxide conductive layer, the method further includes: forming a via hole in the organic planar layer and in the oxide conductive layer at a location corresponding to the drain electrode of the TFT, then the first electrode and the inert metal layer are electrically connected to the drain electrode of the TFT through the via hole. That is, forming the via hole in the organic planar layer and in the oxide conductive layer. The inert metal layer is electrically connected to the drain electrode of the TFT by directly contacting there-with through the via hole. The first electrode is in direct contact with the inert metal layer and electrically connected to the drain electrode.

The via hole can be formed in various ways. For example, the via hole can be simultaneously formed in the organic planar layer and in the oxide conductive layer at the location corresponding to the drain electrode of the TFT after forming the organic planar layer and the oxide conductive layer; and it can also be formed by forming the organic planar layer and a via hole in the organic planar layer at the location corresponding to the drain electrode, and then forming the oxide conductive layer and the via hole at the location corresponding to the drain electrode.

The embodiments of the present invention provide an array substrate, a manufacture method thereof and a display device. The array substrate includes a first electrode; a second electrode; a light-emitting functional layer located between the first electrode and the second electrode; and an organic planar layer. The first electrode is formed on the organic planar layer. The first electrode includes metal electrode or metal alloy electrode. An oxide conductive layer is further formed between the organic planar layer and the metal electrode or metal alloy electrode. The oxide conductive layer has a good adhesion to both of the organic planar layer and the metal or metal alloy electrode, and it also has a thermal coefficient of expansion which is little different from that of both of the organic planar layer and the first electrode, as a result, it is rare that both of the oxide conductive layer formed on the organic planar layer and the metal or metal alloy electrode formed on the oxide conductive layer separates therefrom. In addition, the lattice deformation of the oxide conductive layer is helpful for buffering and releasing the stress of the first electrode and the organic planar layer which are disposed adjacent to the oxide conductive layer, which also allows both the first electrode and the organic planar layer to reduce separation from the oxide conductive layer.

It is understood that the described above are just exemplary implementations of the present invention and the invention is not intended to be limited thereto. An ordinary skill in the art can make various variations and modifications to the present invention without departure from the spirit and the scope of the present invention, and such variations and modifications shall fall in the scope of the present invention. The scope of the present invention is defined by the claims.

The present application claims the priority of Chinese patent application No. 201410720593.9 filed on Dec. 1, 2014, and entitled "ARRAY SUBSTRATE, MANUFACTURE METHOD THEREOF, DISPLAY DEVICE", which is incorporated herein by reference entirely.

What is claimed is:

1. An array substrate, comprising sequentially:
   a substrate;
   an organic planar layer formed on the substrate;
   an oxide conductive layer on the organic planar layer;
   an inert metal layer on the oxide conductive layer, the inert metal layer being made from a material selected from the group consisting of Ta and Nb, or a combination thereof;
   a first electrode formed on the inert metal layer;
   a light-emitting functional layer; and
   a second electrode;
   wherein the first electrode is made from a material selected from the group consisting of a metal or metal alloy; and
   the organic planar layer has a thermal coefficient of expansion substantially same as that of the oxide conductive layer and the first electrode, respectively.

2. The array substrate according to claim 1, wherein the oxide conductive layer is made from a material selected from the group consisting of ITO, IZO, ITZO, and IGZO, or a combination thereof.

3. The array substrate according to claim 2, further comprising a thin film transistor (TFT) located below the organic planar layer, wherein the organic planar layer is formed with a via hole at a location corresponding to a drain electrode of the TFT, and the first electrode, the inert metal layer, and the oxide conductive layer are electrically connected to the drain electrode of the TFT through the via hole; or, the organic planar layer and the oxide conductive layer are formed with a via hole at a location corresponding to a drain electrode of the TFT, and the first electrode and the inert metal layer are electrically connected to the drain electrode of the TFT through the via hole; or, the organic planar layer, the oxide conductive layer, and the inert metal layer are formed with a via hole at a location corresponding to a drain electrode of the TFT, and the first electrode is electrically connected to the drain electrode of the TFT by directly contacting there-with through the via hole.

4. The array substrate according to claim 2, further comprising a thin film transistor (TFT) located below the organic planar layer, wherein the organic planar layer is formed with a via hole at a location corresponding to a drain electrode of the TFT, and the first electrode and the oxide conductive layer are electrically connected to the drain electrode of the TFT through the via hole; or, the organic planar layer and the oxide conductive layer are formed with a via hole at a location corresponding to a drain electrode of the TFT, and the first electrode is electrically connected to the drain electrode of the TFT by directly contacting there-with through the via hole.

5. The array substrate according to claim 1, wherein the metal comprises Al; and the metal alloy comprises an Al-alloy.

6. The array substrate according to claim 5, wherein the Al-alloy comprises an Al—Nd alloy, or an Al—B—Ni alloy.

7. The array substrate according to claim 1, further comprising a thin film transistor (TFT) located below the organic planar layer, wherein the organic planar layer is formed with a via hole at a location corresponding to a drain electrode of the TFT, and the first electrode and the oxide conductive layer are electrically connected to the drain electrode of the TFT through the via hole; or, the organic planar layer and the oxide conductive layer are formed with a via hole at a location corresponding to a drain electrode of the TFT, and the first electrode is electrically connected to the drain electrode of the TFT by directly contacting there-with through the via hole.

8. The array substrate according to claim 1, further comprising a thin film transistor (TFT) located below the organic planar layer; wherein the organic planar layer is formed with a via hole at a location corresponding to a drain electrode of the TFT, and the first electrode, the inert metal layer, and the oxide conductive layer are electrically connected to the drain electrode of the TFT through the via hole; or, the organic planar layer and the oxide conductive layer are formed with a via hole at a location corresponding to a drain electrode of the TFT, and the first electrode and the inert metal layer are electrically connected to the drain electrode of the TFT through the via hole; or, the organic planar layer, the oxide conductive layer, and the inert metal layer are formed with a via hole at a location corresponding to a drain electrode of the TFT, and the first electrode is electrically connected to the drain electrode of the TFT by directly contacting there-with through the via hole.

9. A display device, comprising an array substrate wherein the array substrate comprises sequentially:
a substrate;
an organic planar layer formed on the substrate;
an oxide conductive layer on the organic planar layer;
an inert metal layer on the oxide conductive layer, the inert metal layer being made from a material selected from the group consisting of Ta and Nb, or a combination thereof;
a first electrode formed on the inert metal layer;
a light-emitting functional layer, and a second electrode;
wherein the first electrode is made from a material selected from the group consisting of a metal or metal alloy; and
the organic planar layer has a thermal coefficient of expansion substantially same as that of the oxide conductive layer and the first electrode, respectively.

10. A method of manufacturing an array substrate, comprising:
forming an organic planar layer;
forming an oxide conductive layer on the organic planar layer;
forming an inert metal layer on the oxide conductive layer, the inert metal layer being made from a material selected from the group consisting of Ta and Nb, or a combination thereof;
forming a first electrode on the inert metal layer, wherein the first electrode is made from a material selected from the group consisting of a metal electrode or metal alloy electrode; and
forming a light-emitting functional layer and a second electrode sequentially on the first electrode; and
wherein the organic planar layer has a thermal coefficient of expansion substantially same as that of the oxide conductive layer and the first electrode, respectively.

11. The method according to claim 10, further comprising, before forming the organic planar layer, forming a thin film transistor (TFT);
wherein the forming of the organic planar layer comprises: forming a via hole in the organic planar layer at a location corresponding to a drain electrode of the TFT to allow the first electrode and the oxide conductive layer to be electrically connected to the drain electrode of the TFT through the via hole; or, before forming the first electrode, forming a via hole in the organic planar layer and in the oxide conductive layer at a location corresponding to a drain electrode of the thin film transistor (TFT) to allow the first electrode to be electrically connected to the drain electrode of the TFT by directly contacting there-with through the via hole.

12. The method according to claim 10, further comprising: before forming the organic planar layer, forming a thin film transistor (TFT);
wherein the forming of the organic planar layer comprises:
forming a via hole in the organic planar layer at a location corresponding to a drain electrode of the TFT to allow the first electrode, the inert metal layer and the oxide conductive layer to be electrically connected to the drain electrode of the TFT through the via hole; or,
before forming the inert metal layer on the oxide conductive layer, forming a via hole in the organic planar layer and in the oxide conductive layer at a location corresponding to a drain electrode of the thin film transistor (TFT) to allow the first electrode and the inert metal layer to be electrically connected to the drain electrode of the TFT through the via hole; or
before forming the first electrode, forming a via hole in the organic planar layer, in the oxide conductive layer and in the inert metal layer at a location corresponding to a drain electrode of the TFT to allow the first electrode to be electrically connected to the drain electrode of the TFT by directly contacting there-with through the via hole.

13. The method according to claim 10, wherein the oxide conductive layer is made from a material selected from the group consisting of ITO, IZO, ITZO, and IGZO, or a combination thereof.

14. The method according to claim 13, wherein the Al-alloy is an Al—Nd alloy, or an Al—B—Ni alloy.

15. The method according to claim 10, wherein the metal is Al; and the metal alloy is an Al-alloy.

* * * * *